US008355252B2

(12) United States Patent
Chan et al.

(10) Patent No.: US 8,355,252 B2
(45) Date of Patent: Jan. 15, 2013

(54) SERVER RACK AND ELECTRONIC SYSTEM INCORPORATING THE SAME

(75) Inventors: Hung-Chou Chan, Tu-Cheng (TW);
Zhen-Xing Ye, Shenzhen (CN);
Xian-Guang Tan, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 92 days.

(21) Appl. No.: 13/092,982

(22) Filed: Apr. 25, 2011

(65) Prior Publication Data
US 2012/0162904 A1    Jun. 28, 2012

(30) Foreign Application Priority Data
Dec. 28, 2010 (CN) .......................... 2010 1 0608998

(51) Int. Cl.
*H05K 7/20* (2006.01)
(52) U.S. Cl. .......................... 361/695; 361/694; 454/184
(58) Field of Classification Search .................. None
See application file for complete search history.

(56) References Cited

U.S. PATENT DOCUMENTS

| 5,150,277 | A | * | 9/1992 | Bainbridge et al. | 361/695 |
|---|---|---|---|---|---|
| 5,297,004 | A | * | 3/1994 | Mazura | 361/690 |
| 5,684,624 | A | * | 11/1997 | Wieber et al. | 359/384 |
| 6,554,697 | B1 | * | 4/2003 | Koplin | 454/184 |
| 6,735,079 | B2 | * | 5/2004 | Huang | 361/695 |
| 6,776,707 | B2 | * | 8/2004 | Koplin | 454/184 |
| 6,842,349 | B2 | * | 1/2005 | Wrycraft et al. | 361/796 |
| 7,663,881 | B2 | * | 2/2010 | Kuo | 361/692 |
| 2010/0157521 | A1 | * | 6/2010 | Liu et al. | 361/679.46 |

* cited by examiner

*Primary Examiner* — Gregory Thompson
(74) *Attorney, Agent, or Firm* — Altis Law Group, Inc.

(57) ABSTRACT

An exemplary server rack includes a box adapted for receiving a plurality of servers therein, a plurality of pivoting members pivotally connected to the box; and a plurality of covers fixed to the pivoting members respectively. The box includes a front board and a back board opposite to the front board. The front board and the back board both define a plurality of though holes adapted for airflow to pass therethrough. Each cover is operable to pivot relative to the box via the corresponding pivoting member, and thereby cover some of the through holes of the front board of the box.

13 Claims, 5 Drawing Sheets

SERVER RACK AND ELECTRONIC SYSTEM INCORPORATING THE SAME

BACKGROUND

1. Technical Field

The present disclosure relates to server racks, and particularly to a server rack with effective heat dissipation and an electronic system incorporating the server rack.

2. Description of Related Art

A server center generally includes a server rack and a plurality of servers stacked in the server rack. When the servers are working, they generate a large amount of heat, and therefore effective heat dissipation is necessary.

Cooling fans are generally provided to cool the server center. Airflow generated by the fans flows through the servers, and is expelled to an outer environment, whereby heat generated by the servers is dissipated. However, sometimes some of the servers are not working, and the airflow generated by the fans still flows through these servers. This wastes energy.

What is needed, therefore, is a server rack which can overcome the above-described problems.

BRIEF DESCRIPTION OF THE DRAWINGS

Many aspects of the present embodiment(s) can be better understood with reference to the accompanying drawings. The components in the drawings are not necessarily drawn to scale, the emphasis instead placed upon clearly illustrating the principles of the present embodiment(s). Moreover, in the drawings, like reference numerals designate corresponding parts throughout the several views.

DETAILED DESCRIPTION

Figure 1:
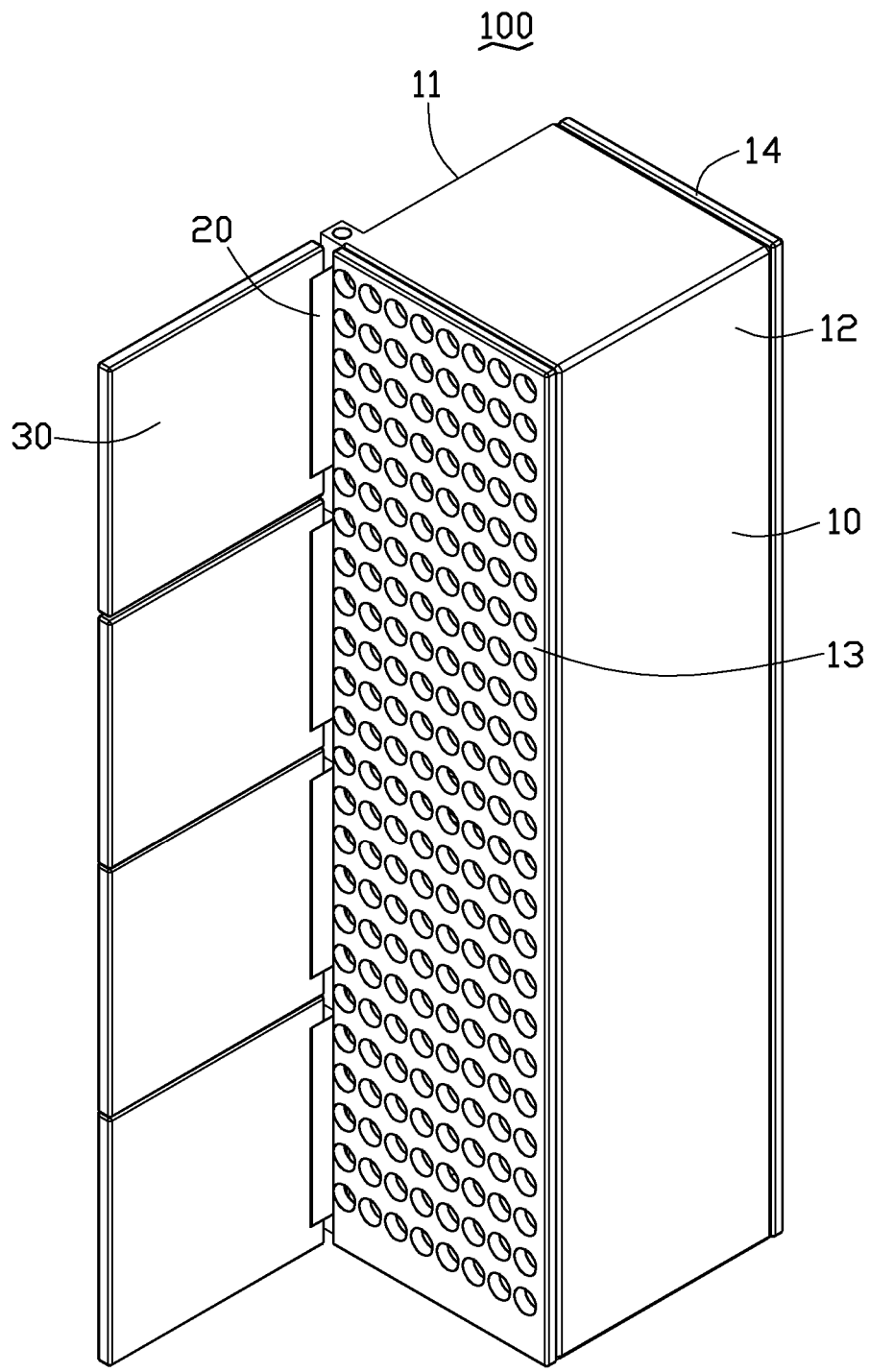
FIG. 1 is an assembled, isometric view of a server rack in accordance with an embodiment of the disclosure.
Figure 5:
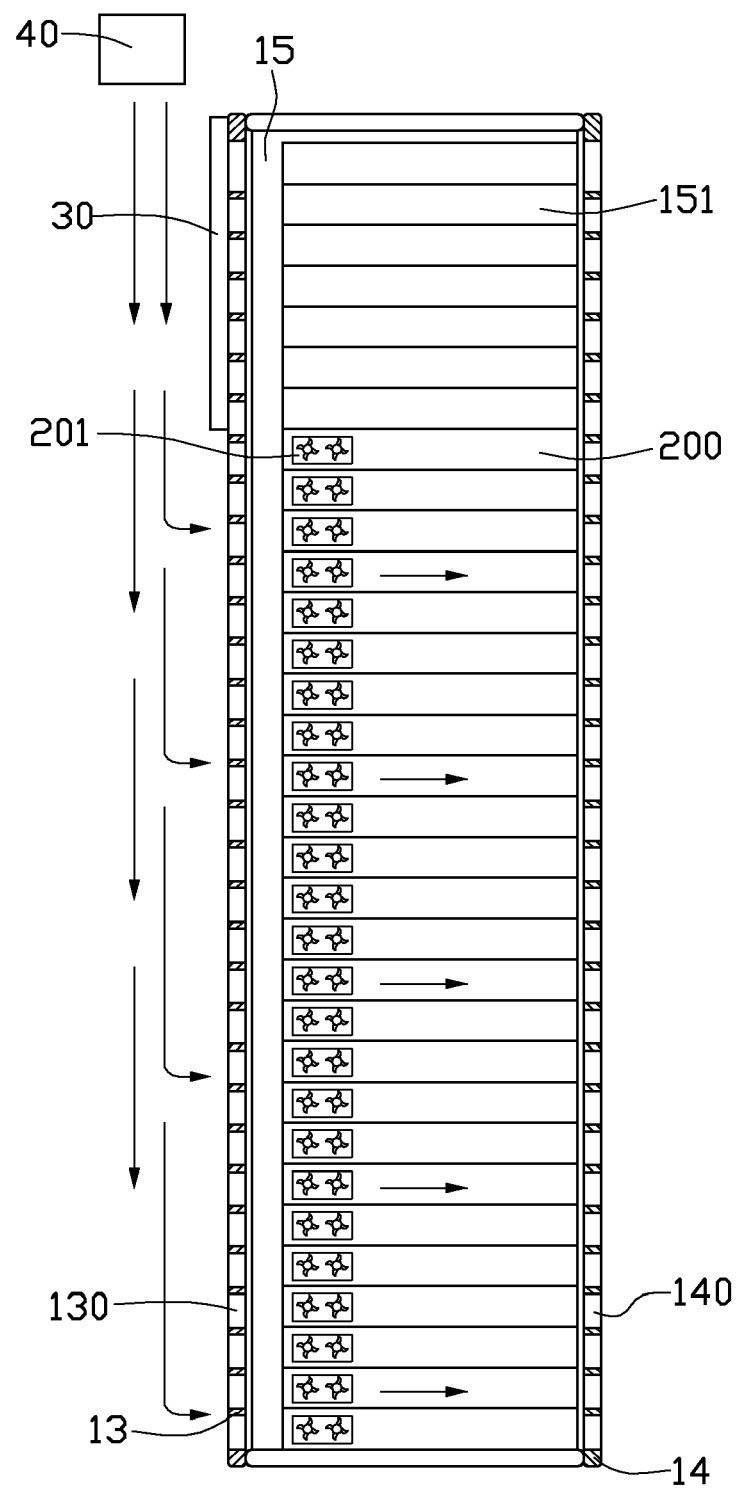
FIG. 5 shows a schematic side cross-sectional view of airflow passing through the server rack of FIG. 4, wherein a plurality of servers are received in the server rack except for a top portion of the server rack.

Referring to the FIGS. 1 and 5, a server rack 100 in accordance with an embodiment of the disclosure is shown. The server rack 100 comprises a cuboid box 10, a plurality of pivoting members (or hinge members) 20 pivotally connected to the box 10, and a plurality of covers respectively 30 fixed to the pivoting members 20.

The box 10 defines a cavity 15 therein, and the cavity 15 is divided into a plurality of receiving rooms 151. A server 200 can be correspondingly received in one receiving room 151. The box 10 has four upright lateral boards, i.e., a left board 11, a right board 12, a front board 13, and a back board 14.

Figure 2:
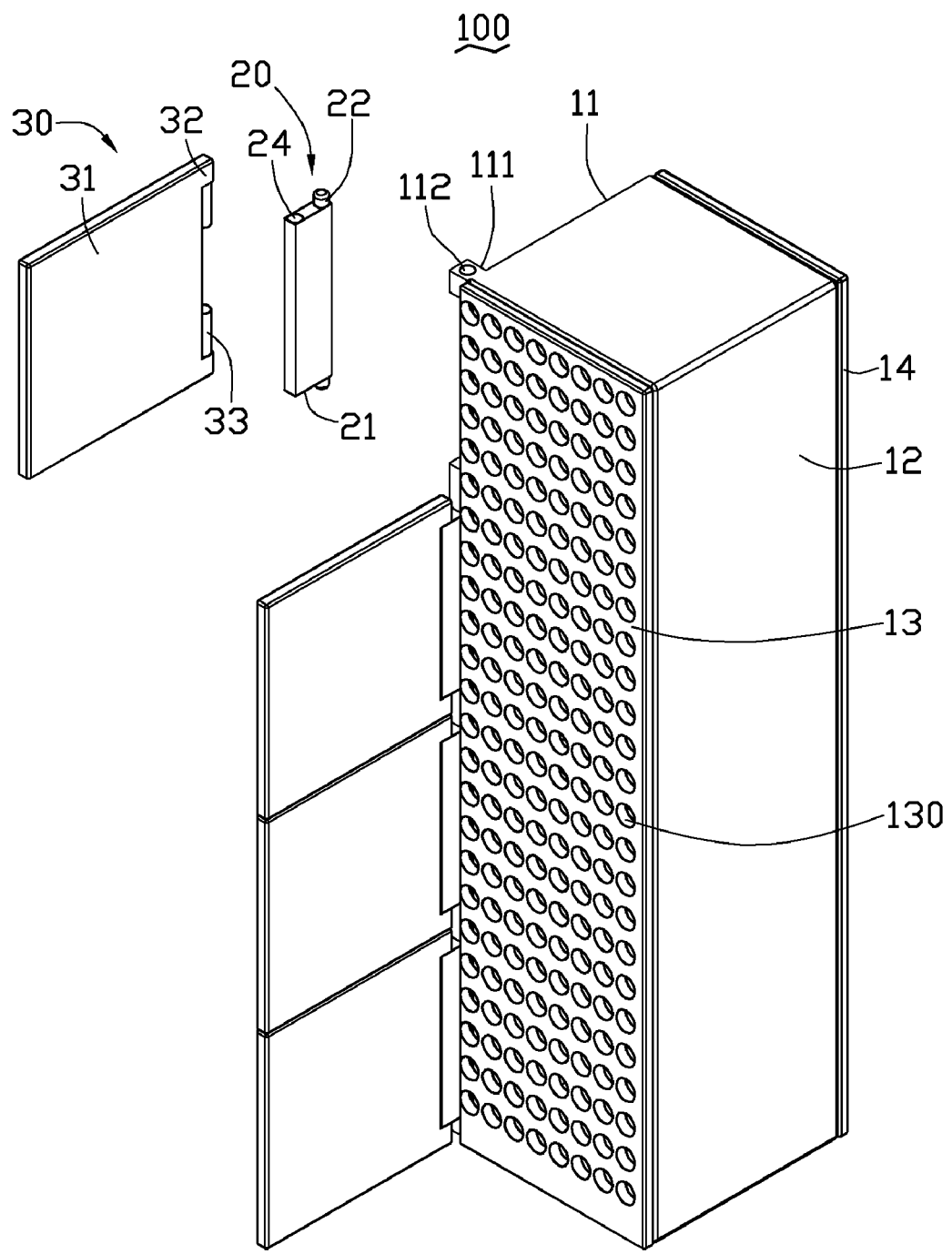
FIG. 2 is an exploded view of the server rack of FIG. 1.

Referring to FIG. 2 also, a plurality of engaging portions 111 extending outwardly from a lateral side of the box 10. In the illustrated embodiment, the engaging portions 111 are in the form of knuckles, and extend outwardly from the left board 11. The engaging portions 111 are located close to a junction of the left board 11 and the front board 13. The engaging portions 111 are spaced from and aligned with each other. In this embodiment of the disclosure, there are five engaging portions 111. The engaging portions 111 are arranged evenly from a top end to a bottom end of the box 10. A vertical axial hole 112 is defined at a center of each engaging portion 111. The axial holes 112 of the engaging portion 111 are all coaxial with one another.

A plurality of first through holes 130 are defined in the front board 13. The first though holes 130 are spaced from each other and arranged evenly in a matrix across substantially an entire expanse of the front board 13. A plurality of second through holes 140 are defined in the back board 14. The second though holes 140 are spaced from each other and arranged evenly in a matrix across substantially an entire expanse of the back board 14. The first and second through holes 130, 140 communicate the receiving rooms 151 of the box 10 with the outer environment.

Figure 3:
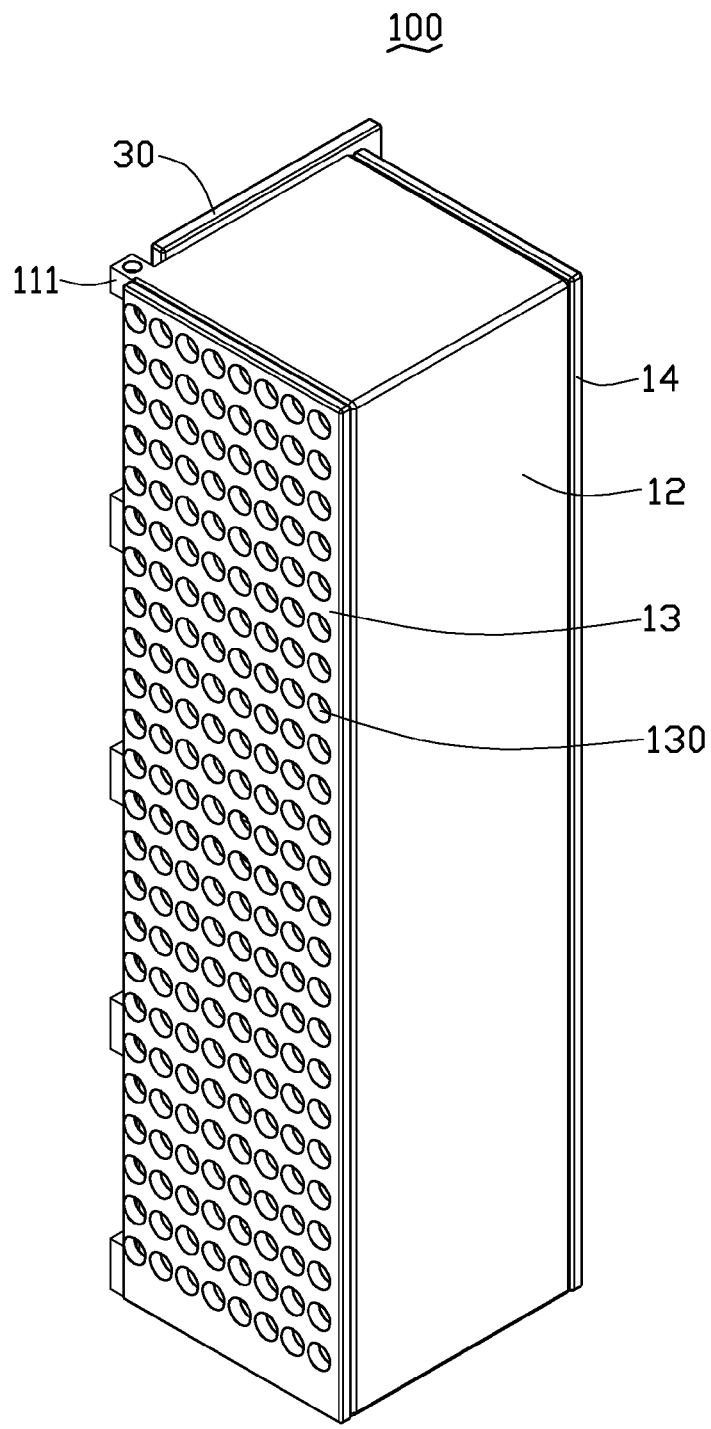
FIG. 3 is similar to FIG. 1, but showing covers of the server rack rotated to positions where they are attached to a left board of the server rack.
Figure 4:
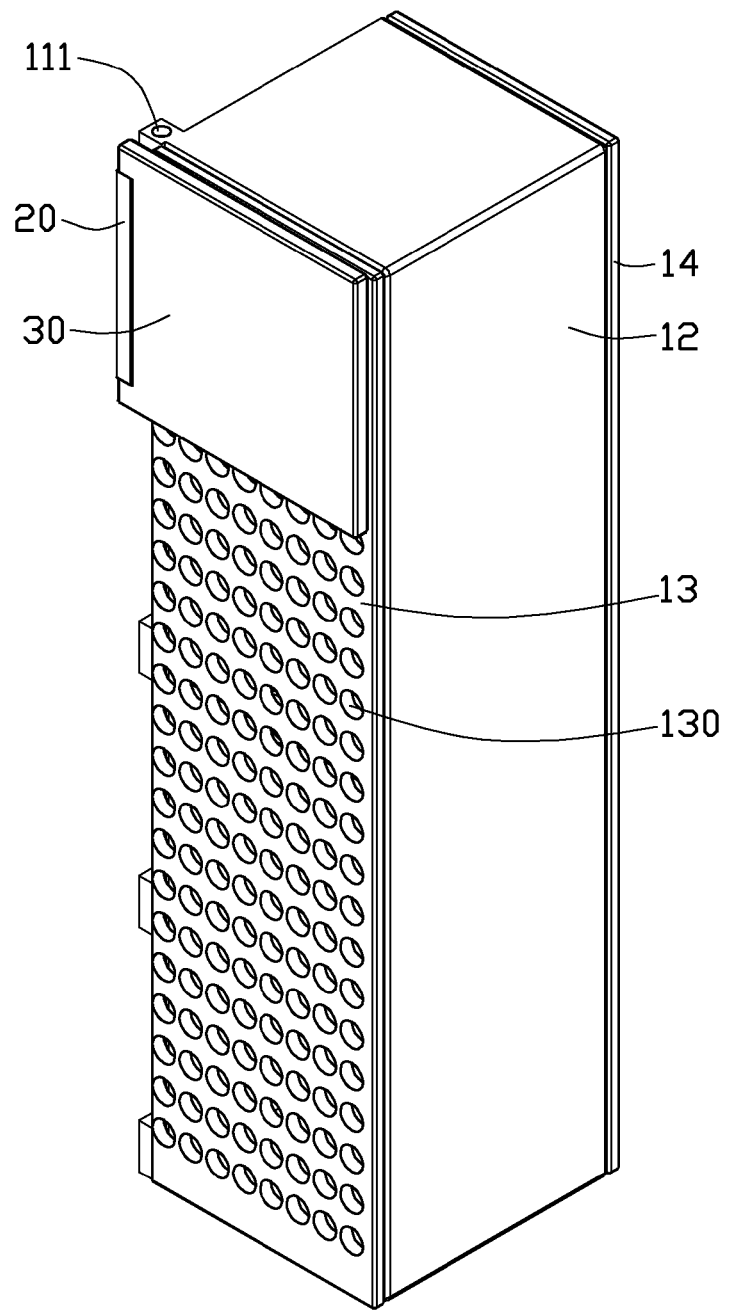
FIG. 4 is similar to FIG. 3, but showing one of the covers rotated to a position where it is attached to a front board of the server rack.

Referring to FIGS. 3 and 4 also, each of the pivoting members 20 comprises a main body 21, and two posts 22 extending outwardly from two opposite top and bottom faces of the main body 21 respectively. The posts 22 are located adjacent a lateral side of the main body 21. Two fixing holes 24 are defined in the top and bottom faces of the main body 21 respectively, adjacent to an opposite lateral side of the main body 21. The two posts 22 of the pivoting member 20 are inserted into two axial holes 112 of two corresponding adjacent engaging portions 111 of the box 10 respectively, whereby the pivoting member 20 is pivotally connected to the box 10 and rotatable about the engaging portions 111. The pivoting members 20 can be rotated relative to the box 10 from the left board 11 to the front board 13. In this embodiment of the disclosure, each two adjacent pivoting members 20 share a corresponding engaging portion 111 therebetween, so that there are four pivoting members 20 engaging with the five engaging portions 111.

Each of the covers 30 comprises a rectangular plate 31, two protruding blocks 32 respectively protruding outwardly from a lateral side of the plate 31, and two protruding poles (or posts) 33 extending inwardly toward each other from inner lateral faces of the protruding blocks 32, respectively. The two protruding blocks 32 are located at two opposite top and bottom ends of the lateral side of the plate 31. The protruding blocks 32 are parallel to each other, have a same thickness as the plate 31, and are substantially coplanar with the plate 31. A distance between the two protruding blocks 32 is substantially equal to a length of the main body 21 of the pivoting member 20. The protruding poles 33 are coaxial with each other.

Each of the covers 30 is engaged with a corresponding pivoting member 20. In particular, the main body 21 is sandwiched between the two protruding blocks 32 of the cover 30, and the two protruding poles 33 are inserted into the two fixing holes 24 of the main body 21, whereby the cover 30 is fixed to the pivoting member 20. Thus, the covers 30 can be rotated relative to the engaging portions 111 of the box 10 via the pivoting members 20. In this embodiment of the disclosure, there are four covers 30 engaging with the four pivoting members 20 respectively. A width of each cover 30 is equal to that of the front board 13 of the box 10, and a total height of the covers 30 is substantially equal to a height of the front board 13, whereby when all of the covers 30 are rotated to be attached to the front board 13, the first through holes 130 are covered by the covers 30, in more detail, each of the covers 30 is used for being operated to cover corresponding part of the first through holes 130 of the box 10.

The server rack 100 can be further provided with an air conditioner 40 adapted for providing cool airflow towards the box 10, and a plurality of exhaust fans 201 correspondingly disposed in the receiving rooms 151 of the box 10. In use, the airflow passes through the first through holes 130 of the front board 13, then through the receiving rooms 151 in which the servers 200 are received, and finally through the second through holes 140 of the back board 14 to the outer environment. Referring to FIGS. 4 and 5 again, when some of the servers 200 are not working and/or when some of the receiving rooms are empty without servers 200 disposed therein, one or more of the covers 30 corresponding thereto can be rotated to be attached to the front board 13. Thereby, the corresponding first holes 130 are covered by the cover(s) 30, so as to bar (block) airflow from entering the corresponding receiving rooms 151. As shown in FIGS. 4 and 5, a top portion of the cavity 15 have no servers 200 mounted therein, and thus a topmost cover 30 is rotated to overlap a top portion of the front board 13 corresponding to the top portion of the cavity 15, thereby barring (blocking) airflow from entering the top portion of the cavity 15. Accordingly, the airflow can be more efficiently utilized, and the heat dissipation efficiency of the server rack 100 is thus enhanced.

It is to be understood, however, that even though numerous characteristics and advantages of the present embodiment(s) have been set forth in the foregoing description, together with details of the structures and functions of the embodiment(s), the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server rack comprising:
   a box adapted for receiving a plurality of servers therein, the box comprising a front board and a back board opposite to the front board, the front board and the back board both defining a plurality of though holes adapted for airflow to pass therethrough;
   a plurality of pivoting members pivotally connected to the box; and
   a plurality of covers correspondingly fixed to the pivoting members, each cover being operable to pivot relative to the box via the corresponding pivoting member and thereby cover some of the through holes of the front board of the box.

2. The server rack of claim 1, wherein the box further comprises a plurality of engaging portions extending outwardly from the front board, two opposite ends of each pivoting members are pivotally engaged with two engaging portions respectively.

3. The server rack of claim 2, wherein an axial hole is defined in each engaging portion, and each of the pivoting members comprises a main body and two posts extending outwardly from two opposite faces of the main body respectively, each post is inserted into the axial hole of a corresponding engaging portion.

4. The server rack of claim 3, wherein each of the covers comprises a rectangular plate, two protruding blocks protruding outwardly from a lateral side of the plate, and a protruding pole extending inwardly from an inner lateral face of each protruding block.

5. The server rack of claim 4, wherein each of the covers is correspondingly engaged with a pivoting member, the main body of the pivoting member is sandwiched between the two protruding blocks of the cover, and the two protruding poles of the pivoting member are inserted into the main body.

6. The server rack of claim 1, wherein the airflow flows through the through holes of the front board, and then through receiving rooms defined in the box, and the through holes of the back board to an outer environment.

7. The server rack of claim 1, wherein the through holes are arranged evenly in the front board and the back board.

8. The server rack of claim 2, wherein the engaging portions are located at a lateral side of the front board.

9. The server rack of claim 8, wherein the engaging portions are spaced from and aligned with each other.

10. The server rack of claim 1, wherein a width of each cover is equal to that of the front board of the box, and total height of the covers is substantially equal to a height of the front board.

11. The server rack of claim 1, further comprising a plurality of exhaust fans disposed in the box.

12. The server rack of claim 1, wherein each cover is also operable to pivot relative to the box via the corresponding pivoting member, and expose the through holes of the front board to the airflow.

13. An electronic system comprising:
    a plurality of servers; and
    a server rack receiving the servers therein, the server rack comprising:
    a front board and a back board opposite to the front board, the front board and the back board both defining a plurality of though holes adapted for airflow to pass therethrough;
    a plurality of pivoting members pivotally connected to the server rack; and
    a plurality of covers correspondingly fixed to the pivoting members, wherein each cover is operable to pivot relative to the server rack via the corresponding pivoting member and thereby cover some of the through holes of the front board of the server rack.

* * * * *